United States Patent
Lim et al.

(10) Patent No.: US 9,478,261 B1
(45) Date of Patent: Oct. 25, 2016

(54) SEMICONDUCTOR MEMORY DEVICE AND OPERATING METHOD THEREOF

(71) Applicant: SK hynix Inc., Icheon-si Gyeonggi-do (KR)

(72) Inventors: Sung Yong Lim, Uiwang-si (KR); Seung Hwan Baek, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/963,489

(22) Filed: Dec. 9, 2015

(30) Foreign Application Priority Data

Jul. 10, 2015 (KR) .................. 10-2015-0098492

(51) Int. Cl.
*G11C 7/10* (2006.01)
*G11C 7/04* (2006.01)
*G11C 7/22* (2006.01)
*G11C 7/12* (2006.01)

(52) U.S. Cl.
CPC . *G11C 7/04* (2013.01); *G11C 7/10* (2013.01); *G11C 7/12* (2013.01); *G11C 7/22* (2013.01)

(58) Field of Classification Search
CPC .... G11C 11/5642; G11C 13/004; G11C 7/12
See application file for complete search history.

(56) References Cited

U.S. PATENT DOCUMENTS

| 2013/0194872 A1* | 8/2013 | Sim .................. G11C 16/26 365/185.17 |
| 2016/0027485 A1* | 1/2016 | Park .................. G11C 29/021 365/191 |

FOREIGN PATENT DOCUMENTS

| KR | 1020130037061 A | 4/2013 |
| KR | 1020130092174 A | 8/2013 |

* cited by examiner

*Primary Examiner* — Tuan T Nguyen
(74) *Attorney, Agent, or Firm* — William Park & Associates Ltd.

(57) ABSTRACT

A semiconductor memory device may include a memory cell array, a plurality of page buffers respectively connected to a plurality of bit lines of the memory cell array, and a control logic configured to control the plurality of page buffers to perform an operation on the memory cell array, wherein each of the plurality of page buffers senses a current amount, which varies according to a potential level of a corresponding bit line among the plurality of bit lines, at a sensing node to read data, and a precharge potential level at the sensing node is adjusted according to a temperature.

20 Claims, 5 Drawing Sheets

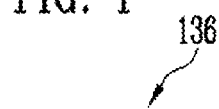
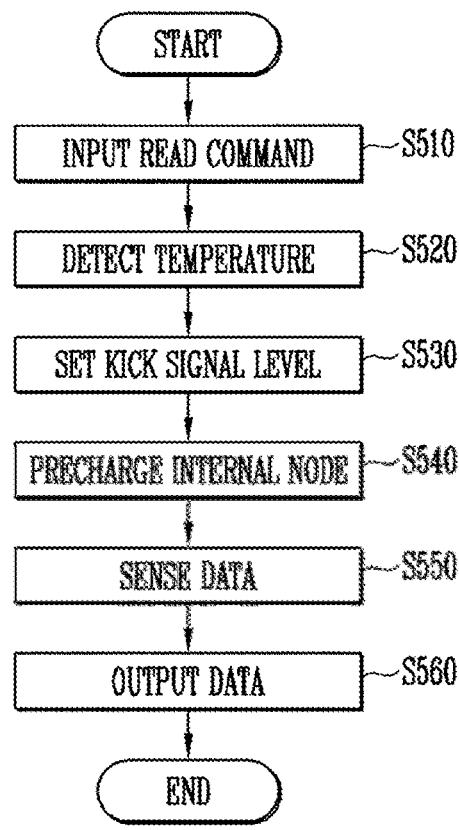

SEMICONDUCTOR MEMORY DEVICE AND OPERATING METHOD THEREOF

CROSS-REFERENCE TO RELATED APPLICATION

The present application claims priority to Korean patent application number 10-2015-0098492 filed on Jul. 10, 2015, in the Korean Intellectual Property Office, the entire disclosure of which is incorporated by reference herein.

BACKGROUND

1. Technical Field

Various embodiments of the present disclosure generally relate to an electronic device, and more particularly, to semiconductor memory device, and an operating method thereof.

2. Related Art

Semiconductor memory devices are memory devices realized using a semiconductor such as silicon (Si), germanium (Ge), gallium arsenide (GaAs), Indium phosphide (InP), or the like. The semiconductor memory devices are largely divided into a volatile memory device and a nonvolatile memory device.

The volatile memory device is a memory device in which data stored therein is lost when power is turned off. The volatile memory device includes a Static RAM (SRAM), Dynamic RAM (DRAM), Synchronous DRAM (SDRAM), or the like. The nonvolatile memory device is a memory device in which data stored therein is maintained even when power is turned off. The nonvolatile memory device may include a read only memory (ROM), programmable ROM (PROM), Electrically Programmable ROM (EPROM), Electrically Erasable and Programmable ROM (EEPROM), Flash memory, Phase-change RAM (PRAM), Magnetic RAM (MRAM), Resistive RAM (RRAM), Ferroelectric RAM (FRAM), or the like. The Flash memories are largely divided into a NOR type and NAND type.

SUMMARY

In an embodiment, a semiconductor memory device may be provided. The semiconductor memory device may include a memory cell array, and a plurality of page buffers respectively connected to a plurality of bit lines of the memory cell array. The semiconductor memory device may include a control logic configured to control the plurality of page buffers to perform anoperation on the memory cell array. Each of the plurality of page buffers may sense a current amount, which varies according to a potential level of a corresponding bit line among the plurality of bit lines, at a sensing node to read data, and a precharge potential level at the sensing node may be adjusted according to a temperature.

In an embodiment, a semiconductor memory device may be provided. The semiconductor memory device may include a memory cell array including a plurality of memory cells, and a plurality of page buffers respectively connected to a plurality of bit lines of the memory cell array. Each of the plurality of page buffers may include a sensing node varying according to a potential level of a corresponding bit line among the plurality of bit lines, and a precharge potential level at the sensing node may be adjusted according to a temperature.

In an embodiment, an operation method of a semiconductor memory device may be provided. The operation method may include detecting a temperature of the semiconductor memory device when a command is externally input. The operation method may include setting a potential level of a kick signal according to the detected temperature. The operation method may include performing a sensing operation using a page buffer, which is connected to a memory cell through a bit line, and adjusting a precharge potential level at a sensing node in the page buffer according to the kick signal. The operation method may include externally outputting sensed data as the sensing operation result.

BRIEF DESCRIPTION OF THE DRAWINGS

FIG. 4 is a circuit diagram representation of an example of a potential level adjusting unit according to an embodiment.

FIG. 5 is a flow chart for explaining a representation of an example of a driving method of a semiconductor memory device according to an embodiment.

DETAILED DESCRIPTION

Figure 1:
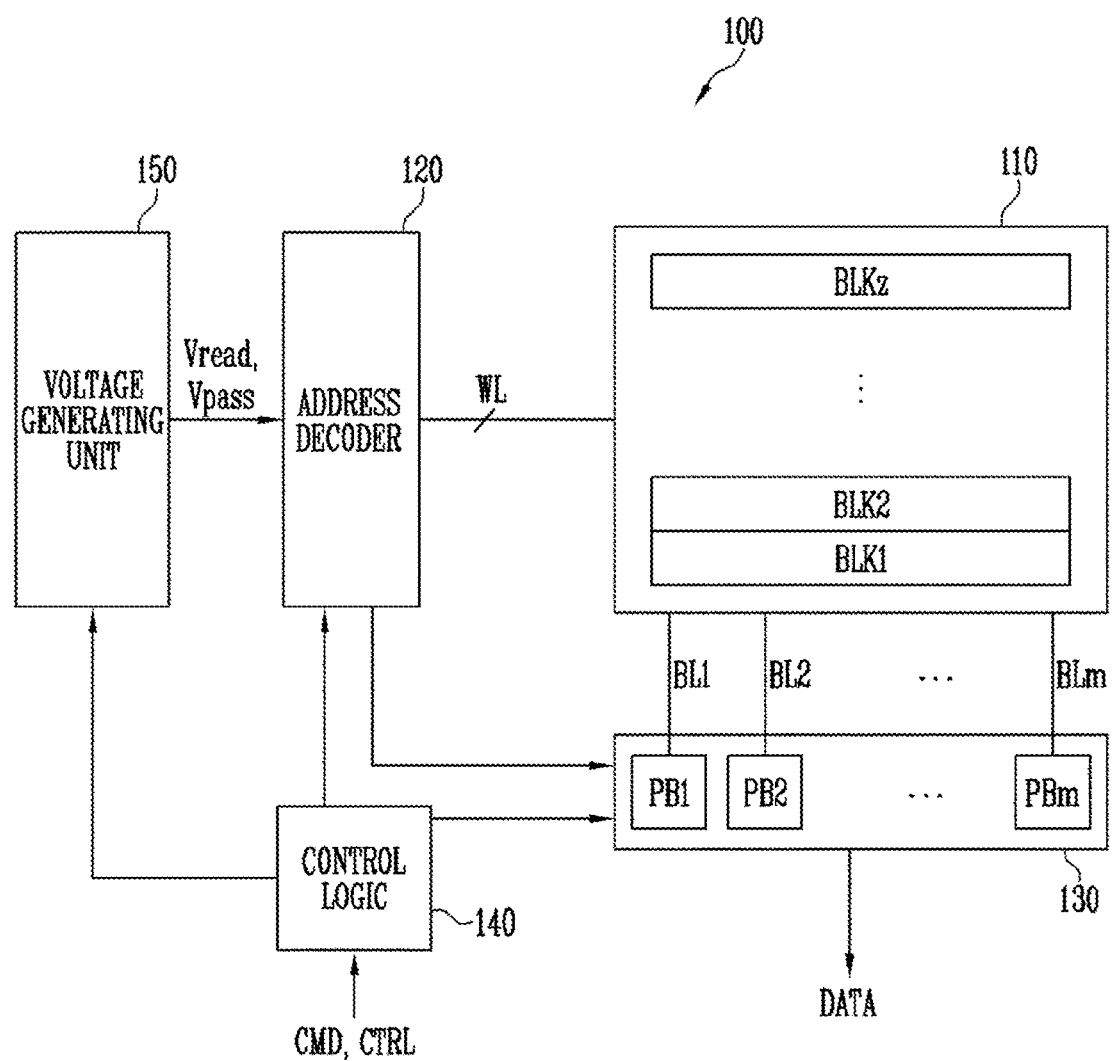
FIG. 1 is a block diagram illustrating a representation of an example of a semiconductor memory device according to an embodiment.

Advantages and features of the present disclosure, and methods for achieving the same will be cleared with reference to various examples of embodiments described later with the accompanying drawings. Accordingly, the present disclosure is not limited to the following embodiments but embodied in other types. Rather, these embodiments are provided so that this disclosure will be thorough, and convey the technical idea of the present disclosure to those skilled in the art.

In addition, if certain parts are described as being connected to other parts, they are not only directly connected to the other parts, but also indirectly connected to the other parts with any other device intervened therebetween. In addition, when an element is referred to as "comprising" or "including" a component, it does not preclude another component but may further include the other component unless the context clearly indicates otherwise.

In the drawing figures, dimensions may be exaggerated for clarity of illustration. In the accompanying figures, like reference numerals refer to identical or functionally similar elements throughout the separate views.

Various embodiments of the present disclosure may be directed to a semiconductor memory device capable of performing an accurate read operation during the read operation and an operating method thereof.

FIG. 1 is a block diagram illustrating a representation of an example of a semiconductor memory device according to an embodiment.

Referring to FIG. 1, a semiconductor memory device 100 may include a memory cell array 110, an address decoder 120, a read and write circuit 130, a control logic 140, and a voltage generating unit 150.

The memory cell array 110 may include a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are nonvolatile memory cells and may be configured with nonvolatile memory cells having a vertical channel structure.

The address decoder 120, the read and write circuit 130, and the control logic 140 operate as peripheral circuits for driving the memory cell array 110.

The address decoder 120 is connected to the memory cell array 110 through the word lines WL. The address decoder 120 operates in response to a control of the control logic 140. The address decoder 120 receives addresses through an input/output buffer (not illustrated) in the semiconductor memory device 100.

The address decoder 120 decodes a block address among the received addresses. The address decoder 120 selects at least one memory block according to the decoded block address. In addition, the address decoder 120 applies a read voltage Vread generated by the voltage generating unit 150 to a word line selected from among a memory block selected during a read voltage application operation in a read operation, and applies a pass voltage Vpass to remaining unselected word lines. In addition, during a program verification operation, the address decoder 120 applies a verification voltage generated by voltage generating unit 150 to the selected word line in the selected memory block and applies the pass voltage Vpass to the unselected word lines.

The address decoder 120 decodes a column address among the received addresses. The address decoder 120 transmits the decoded column address to the read and write circuit 130.

The read operation and program operation of the semiconductor memory device 100 are performed by a page unit. Addresses received at the time of requesting the read and program operations include a block address, row address, and column address. The address decoder 120 selects one memory block and one word line according to the block and row addresses. The column address is decoded by the address decoder 120 to be provided to the read and write circuit 130.

The address decoder 120 may include a block decoder, row decoder, column decoder, address buffer, and the like.

The read and write circuit 130 includes a plurality of page buffers PB1 to PBm. The plurality of page buffers PB1 to PBm are connected to the memory cell array 110 through the bit lines BL1 to BLm. The plurality of page buffers PB1 to PBm sense variation in current amount according to a program state of a corresponding memory cell and latch the variation as sensing data while supplying a sensing current to bit lines connected to the memory cells in order to sense a threshold voltage of the memory cells during the read and program verification operations. Each of the plurality of page buffers PB1 to PBm adjusts a precharge potential level at a sensing node included therein according to a temperature. For example, the read and program verification operations are performed by increasing the precharge potential level at the sensing node when the semiconductor memory device is at a relatively high temperature, and by reducing the precharge potential level at the sensing node when the semiconductor memory device is at a relatively low temperature. The memory cell having the vertical channel structure has a relatively small cell current at a low temperature and a relatively high cell current at a high temperature. Accordingly, a stable sensing operation may be performed by adjusting the precharge potential level at the sensing node according to a temperature during the read and program verification operations to secure a certain sensing margin at the high and low temperatures.

The read and write circuit 130 operates in response to page buffer control signals output from the control logic 140.

The read and write circuit 130 senses data in the memory cells during the read operation to temporally store the read data, and then outputs the data DATA to the input/output buffer (not illustrated) of the semiconductor memory device 100.

As an embodiment, the read and write circuit 130 may include page buffers (or page registers), a column selection circuit, and the like.

The control logic 140 may be connected to the address decoder 120, read and write circuit 130, and voltage generating unit 150. The control logic 140 may receive a command CMD and a control signal CTRL through the input/output buffer of the semiconductor memory device 100. The control logic 140 may control an entire operation of the semiconductor memory device 100 in response to the control signal CTRL.

In an embodiment, the control logic 140 may detect a temperature of the semiconductor memory device 100 to output a control signal for adjusting the precharge potential levels at the sensing nodes of the plurality of page buffers PB1 to PBm according to the detected temperature.

The voltage generating unit 150 may generate the read voltage Vread and pass voltage Vpass during the read operation in response to a control signal for the voltage generating unit, which is output from the control logic 140.

Figure 2:
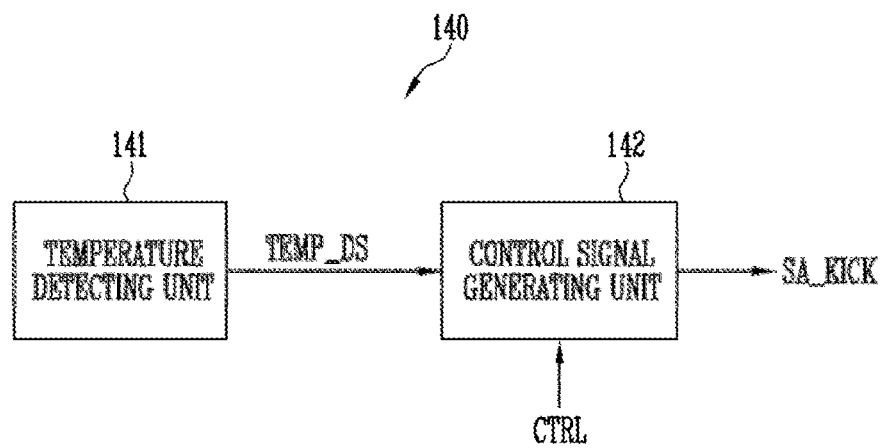
FIG. 2 is a block diagram illustrating a representation of an example of a control logic according to an embodiment.

FIG. 2 is a block diagram illustrating a representation of an example of a control logic according to an embodiment.

Referring to FIG. 2, the control logic 140 may include a temperature detecting unit 141 and a control signal generating unit 142.

The temperature detecting unit 141 may measure a temperature of the semiconductor memory device to output a temperature detection signal TEMP_DS of which a bit value varies according to the temperature.

The control signal generating unit 142 may output a kick signal SA_KICK in response to the control signal CTRL and temperature detection signal TEMP_DS. The control signal generating unit 142 may adjust to output a potential level of the kick signal SA_KICK according to the bit value of the temperature detection signal TEMP_DS. For example, when the temperature detecting signal TEMP_DS is a signal for detecting a relatively high temperature, the potential level of the kick signal SA_KICK is increased and output, and when the temperature detecting signal TEMP_DS is a signal for detecting a relatively low temperature, the potential level of the kick signal SA_KICK is decreased and output.

Figure 3:
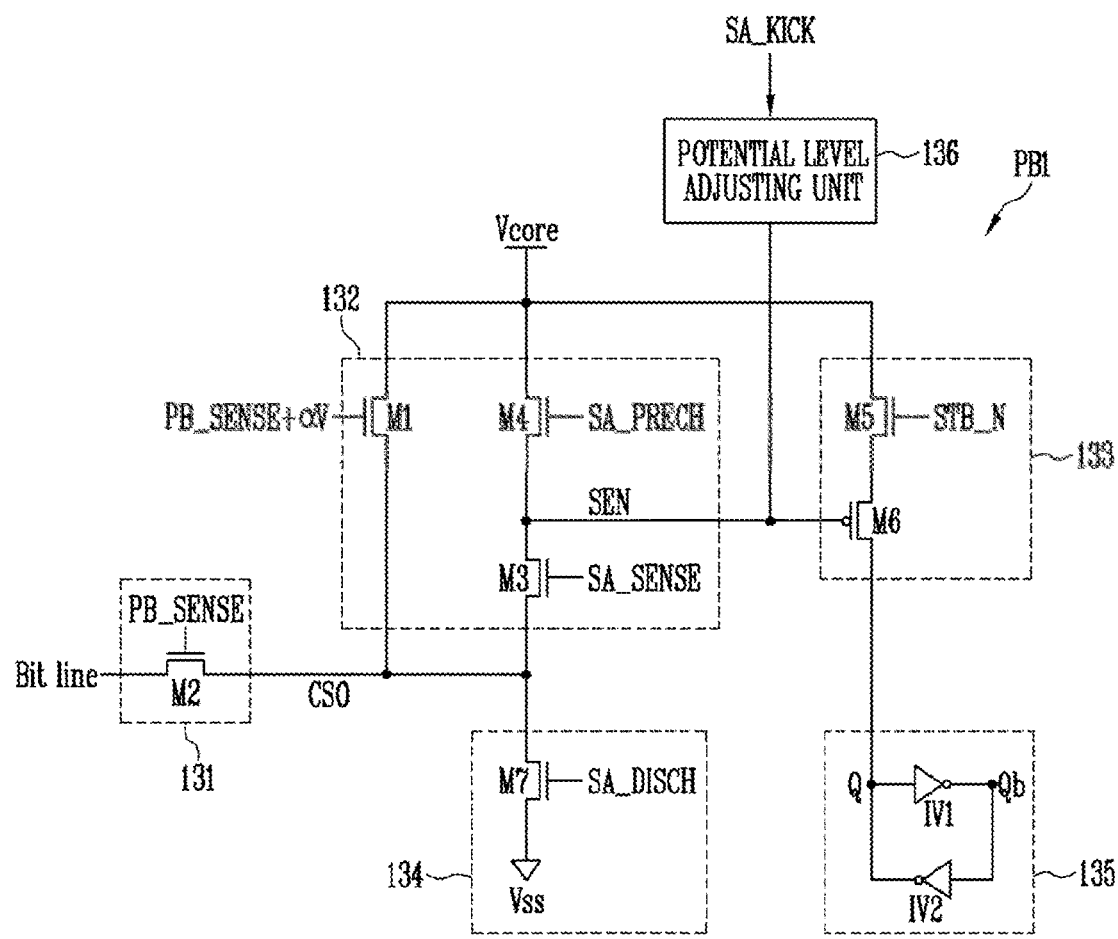
FIG. 3 is a circuit diagram representation of an example of a page buffer according to an embodiment.

FIG. 3 is a circuit diagram representation of an example of a page buffer according to an embodiment.

Referring to FIG. 3, the page buffer PB1 may include a bit line sensing circuit 131, a clamp circuit 132, a current determining circuit 133, an internal node discharge circuit 134, a latch circuit 135, and a potential level adjusting unit 136.

The bit line sensing circuit 131 may be connected between a bit line Bit line and an internal node CSO, and may electrically connect the bit line Bit line and the internal node CSO in response to a page buffer sensing signal PB_SENSE to control a potential at the internal node CSO according to a potential of the bit line Bit line.

The clamp circuit 132 may be connected between a terminal of a power supply voltage Vcore and the internal node CSO and supplies a current to the internal node CSO in response to a set voltage PB_SENSE+αV higher by a certain potential αV than the page buffer sensing signal PB_SENSE applied to the bit line sensing circuit 131, a precharge signal SA_PRECH, and a sensing signal SA_SENSE.

The clamp circuit 132 may include a plurality of transistor M1, M3, and M4. The transistor M1 may be connected between the terminal of the power supply voltage Vcore and the internal node CSO and may be turned on or off in response to the set voltage PB_SENSE+αV. The transistors M4 and M3 may be serially connected between the power supply voltage Vcore and the internal node CSO, the transistor M4 may be turned on or off in response to the precharge signal SA_PRECH, and the transistor M3 may be turned on or off in response to the sensing signal SA_SENSE.

The current determining circuit 133 may be connected between the terminal of the power supply voltage Vcore and the latch circuit 135, and supplies, to the latch circuit 135, a current amount corresponding to the potential at the sensing node SEN that is positioned between the transistors M3 and M4 of the clamp circuit 132.

The current determining circuit 133 may include transistors M5 and M6 serially connected between the terminal of the power supply voltage Vcore and the latch circuit 135. The transistor M5 may be turned on or off in response to a strobe signal STB_N. The transistor M6 may adjust the current amount supplied through the terminal of the power supply voltage Vcore according to the potential at the sensing node SEN to supply it to the latch circuit 135.

The internal node discharge circuit 134 may be connected between the internal node CSO and a ground voltage Vss, and may discharge the internal node CSO to a low level in response to the discharge signal SA_DISCH. The internal node discharge circuit 134 may include a transistor M7 connected between the internal node CSO and the ground voltage Vss, and the transistor M7 may be turned on or off in response to the discharge signal SA_DISCH.

The latch circuit 135 may be connected to the current determining circuit 133 and may store data according to a current amount supplied from the current determining circuit 133. The latch circuit 135 may include inverters IV1 and IV2 reversely connected in parallel between first and second nodes Q and Qb.

The potential level adjusting unit 136 may be connected to the sensing node SENSE and may adjust a precharge potential level at the sensing node SEN in response to the kick signal SA_KICK. For example, when the potential level of the kick signal SA_KICK is high, the precharge potential level of the sensing node SEN is increased, and when the potential level of the kick signal SA_KICK is low, the precharge potential level of the sensing node SEN is decreased.

FIG. 4 is a circuit diagram representation of an example of the potential level adjusting unit according to an embodiment.

Referring to FIG. 4, the potential level adjusting unit 136 may include a capacitor C1 connected to the sensing node SEN. A first electrode of the capacitor C1 may be connected to the sensing node SEN and a second electrode of the capacitor C1 may receive the kick signal SA_KICK.

When the potential level of the kick signal SA_KICK is high, the precharge potential level at the sensing node SEN is increased according to a boosting phenomenon, and when the potential level of the kick signal SA_KICK is low, the precharge potential level at the sensing node SEN is decreased.

FIG. 5 is a flow chart for explaining a representation of an example of driving method of a semiconductor memory device according to an embodiment.

S510) Input Read Command

When a read command is input from, for example, the outside of the semiconductor memory device, the command CMD and control signal CTRL according to the read command may be input to the control logic 140. The control logic 140 may output signals for controlling the address decoder 120, read and write circuit 130, and voltage generating unit 150 in order to perform the read operation according to the command CMD and control signal CTRL.

S520) Detect Temperature

When the command CMD and control signal CTRL are input according to the read operation, the control logic 140 may detect a temperature of the semiconductor memory device. The temperature detecting unit 141 of the control logic 140 may measure the temperature of the semiconductor memory device to output a temperature detection signal TEMP_DS corresponding to the measured temperature.

S530) Set Kick Signal Level

The control signal generating unit 142 of the control logic 141 may output the kick signal SA_KICK in response to the temperature detection signal TEMP_DS output from the temperature detecting unit 141 and the control signal CTRL according to the read operation. At this point, the potential level of the kick signal SA_KICK, which is output when the temperature of the semiconductor memory device is relatively high, is higher than the potential level of the kick signal SA_KICK that is output when the temperature of the semiconductor memory device is relatively low.

S540) Precharge Internal Node

Each of the plurality of page buffers PB1 to PBm pre-may charge the internal node CSO to a certain potential level. The sensing signal SA_SENSE and precharge signal SA_PRECH may be applied at a high level to turn on the transistors M4 and M5. Accordingly, the internal node CSO may be pre-charged to a level of the power supply voltage Vcore. At this point, the precharge level of the sensing node SEN may vary according to the kick signal SA_KICK of which the potential level may vary according to the temperature. For example, the precharge may be performed so that the precharge level is relatively high according to the kick signal SA_KICK that has a relatively high potential level when the temperature of the semiconductor memory device is relatively high, and the precharge level is relatively low according to the kick signal SA_KICK that has a relatively low potential level when the temperature of the semiconductor memory device is relatively low.

S550) Sense Data

The read voltage generated in the voltage generating unit 140 may be applied to the selected word line of the memory block selected from among the plurality of memory blocks BLK1 to BLKz. The remaining unselected word lines may receive the pass voltage Vpass.

Each of the plurality of page buffers PB1 to PBm may perform a data sensing operation. The data sensing operation is, for example, as follows.

The page buffer sensing signal PB_SENSE is applied at a high level to electrically connect the bit line Bit line and the internal node CSO.

After a predetermined time, the precharge signal SA_P-RECH is transitioned from a high level to a low level to cut off the power supply voltage Vcore applied to the internal node CSO. At this point, when a threshold voltage of a memory cell connected to the selected word line is lower than the read voltage Vread, the memory cell is turned on and the potential at the internal node is discharged to a low level by passing the discharge current through the bit line Bit line.

Accordingly, the internal node CSO and the sensing node SEN are discharged to a low level and the transistor M6 is turned on by the sensing node SEN at the low level.

Thereafter, when the strobe signal STB_N at a low level is applied for a certain time to turn on the transistor M5, the power supply voltage Vcore is applied to a first node Q of the latch circuit 135 to allow the first node Q to be at a high level. Accordingly, the latch circuit 135 latches data corresponding to a removing cell.

On the other hand, when the threshold voltage of the memory cell connected to the selected word line is higher than the read voltage Vread, the memory cell is turned off to maintain the potential at the internal node CSO to be the precharge level.

Accordingly, the internal node CSO and the sensing node SEN maintain the precharge level, and thereafter, even if the strobe signal STB_N at a low level is applied for a predetermined time to turn on the transistor M5, the transistor M6 is turned off by the sensing node SEN at the precharge level. Accordingly, the first node Q of the latch circuit 135 maintains the low level, which is an initial state, to allow the latch circuit 135 to latch the data corresponding to a program cell.

The page buffers PB1 to PBm adjust the precharge potential level of the sensing node SEN by the potential level adjusting unit 136 at the time of precharging the internal node. In other words, when the temperature of the semiconductor memory device is relatively high, the precharge potential level of the sensing node is increased in response to the kick signal SA_KICK having a relatively high potential level, and when the temperature of the semiconductor memory device is relatively low, the precharge potential level of the sensing node is decreased in response to the kick signal SA_KICK having a relatively low potential level. The memory cell having the vertical channel structure, which is included in the memory cell array 110, has a relatively small cell current at a low temperature and a relatively high cell current at a high temperature. Accordingly, during a data sensing operation, when the temperature of the semiconductor memory device is low, since the precharge potential level of the sensing node SEN is decreased, a sensing margin similar to that at the high temperature may be secured to accurately sense data Even when the Cell Current Decreases According to the Temperature.

S560) Output data

Each of the page buffers PB1 to PBm outputs data sensed by the sensing operation to the outside thereof.

Although an example of the read operation is described in an embodiment of the present disclosure, the embodiment may be identically applied to a sensing operation of the page buffer during an operation for sensing the threshold voltage of the memory cell, for example, the program verification operation, and may improve accuracy of the program verification operation and a threshold voltage distribution of the memory cell during the program operation.

Figure 6:
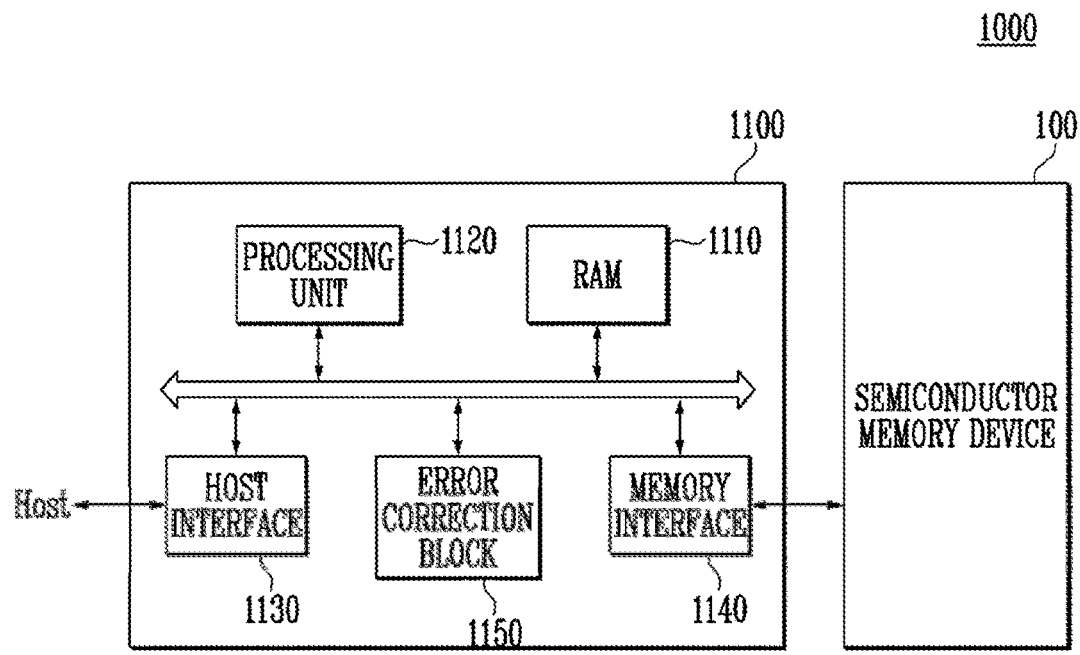
FIG. 6 is a block diagram illustrating a representation of an example of a memory system including the semiconductor memory device of FIG. 1.

FIG. 6 is a block diagram illustrating a representation of an example of a memory system including the semiconductor memory device of FIG. 1.

Referring FIG. 6, a memory system 1000 may include the semiconductor memory device 100 and a controller 1100.

The semiconductor memory device 100 may include the semiconductor device described in relation to FIG. 1. Hereinafter, the repetitive explanations will be omitted.

The controller 1100 is connected to a Host and the semiconductor memory device 100. In response to a request from the Host, the controller 1100 accesses the semiconductor memory device 100.

For example, the controller 1100 controls a read, write, remove, or background operation of the semiconductor memory device 100. The controller 1100 provides an interface between the Host and the semiconductor memory device 100. The controller 1100 drives firmware for controlling the semiconductor memory device 100.

The controller 1100 may include a RAM 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the Host, and a buffer memory between the semiconductor memory device 100 and the Host. The processing unit 1120 controls an entire operation of the controller 1100. In addition, the controller 1100 may temporarily store program data provided from the Host during the write operation.

The host interface 1130 may include a protocol for performing data exchange between the Host and controller 1100. As an embodiment, the controller 1100 communicates with the Host through at least one of various interface protocols including a Universal Serial Bus (USB) protocol, multimedia card (MMC) protocol, peripheral component interconnection (PCI) protocol, PCI-express (PCI-E) protocol, Advanced Technology Attachment (ATA) protocol, Serial-ATA protocol, Parallel-ATA protocol, small computer small interface (SCSI) protocol, enhanced small disk interface (ESDI) protocol, Integrated Drive Electronics (IDE) protocol, private protocol, and the like.

The memory interface 1140 performs interfacing with the semiconductor memory device 100. For example, the memory interface includes a NAND interface or NOR interface.

The error correction block 1150 detects to correct an error in data received from the semiconductor memory device 100 by using an error correction code. The processing unit 1120 may adjust the read voltage according to an error detection result from the error correction block 1150, and control the semiconductor memory device 100 to perform re-reading. As an embodiment, the error correction block may be provided as an element of the controller 1100.

The controller 1100 and the semiconductor memory device 10 may be integrated to one semiconductor device. As an embodiment, the controller 1100 and the semiconductor memory device 100 may be integrated to one semiconductor device and form a memory card. For example, the controller 1100 and the semiconductor memory device 100 may be integrated to one semiconductor device and form a memory card including a personal computer memory card international association (PCMCIA), compact flash card (CF), smart media card (SMC), memory stick multimedia card (MMC, RS-MMC, or MMCmicro), SD card (SD, miniSD, microSD, or SDHC), universal flash storage (UFS), or the like.

The controller 1100 and the semiconductor memory device 100 may be integrated to one semiconductor device and form a solid state drive (SSD). The SSD includes a storage device formed to store data in a semiconductor memory. When the memory system 1000 is used as the SSD, an operation speed of the Host connected to the memory system 2000 may be phenomenally improved.

As another example, the memory system 1000 may be provided as one of various elements of an electronic device including a computer, Ultra Mobile PC (UMPC), workstation, net-book, Personal Digital Assistants (PDA), portable computer, web tablet, wireless phone, mobile phone, smart phone, e-book, portable multimedia player (PMP), game console, navigation device, black box, digital camera, 3-dimensional television, digital audio recorder, digital audio player, digital picture recorder, digital picture player, digital video recorder, digital video player, a device capable of transmitting/receiving information in an wireless environment, one of various devices for forming a home network, one of various electronic devices for forming a computer network, one various electronic devices for forming a telematics network, RFID device, one of various elements for forming a computing system, or the like.

As an embodiment, the semiconductor memory device 100 or the memory system 1000 may be embedded in various types of packages. For example, the semiconductor memory device 100 or the memory system 1000 may be packaged to be embedded in a type including Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 7:
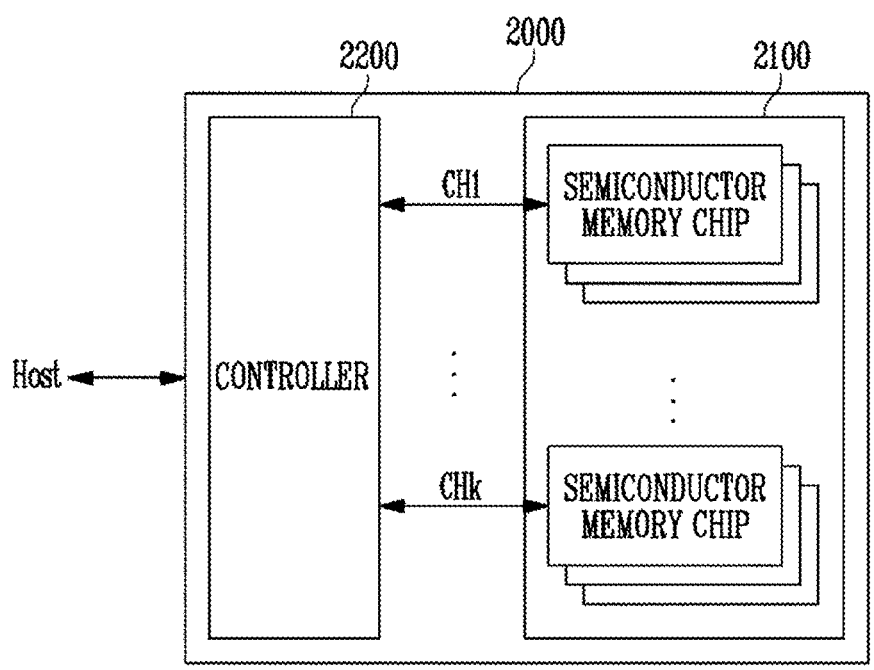
FIG. 7 is a block diagram illustrating a representation of an application example of the memory system of FIG. 6.

FIG. 7 is a block diagram illustrating a representation of an application example of the memory system of FIG. 6.

Referring FIG. 7, the memory system 2000 may include a semiconductor memory device 2100 and a controller 2200. The semiconductor memory device 2100 may include a plurality of memory chips. The plurality of semiconductor memory chips are divided into a plurality of groups.

Referring to FIG. 7, it is illustrated that each of the plurality of groups communicates with the controller 2200 through first to k-th channels CH1 to CHk. Each semiconductor memory chip is configured to identically operate to one of the semiconductor memory device 100 described in relation to FIG. 1.

Each group communicates with the controller 2200 through one common channel. The controller 2200 may be configured identically or substantially identical to the controller 1100 described in relation to FIG. 6 and to control a plurality of memory chips of the semiconductor memory device 2100 through the plurality of channels CH1 to CHk.

Figure 8:
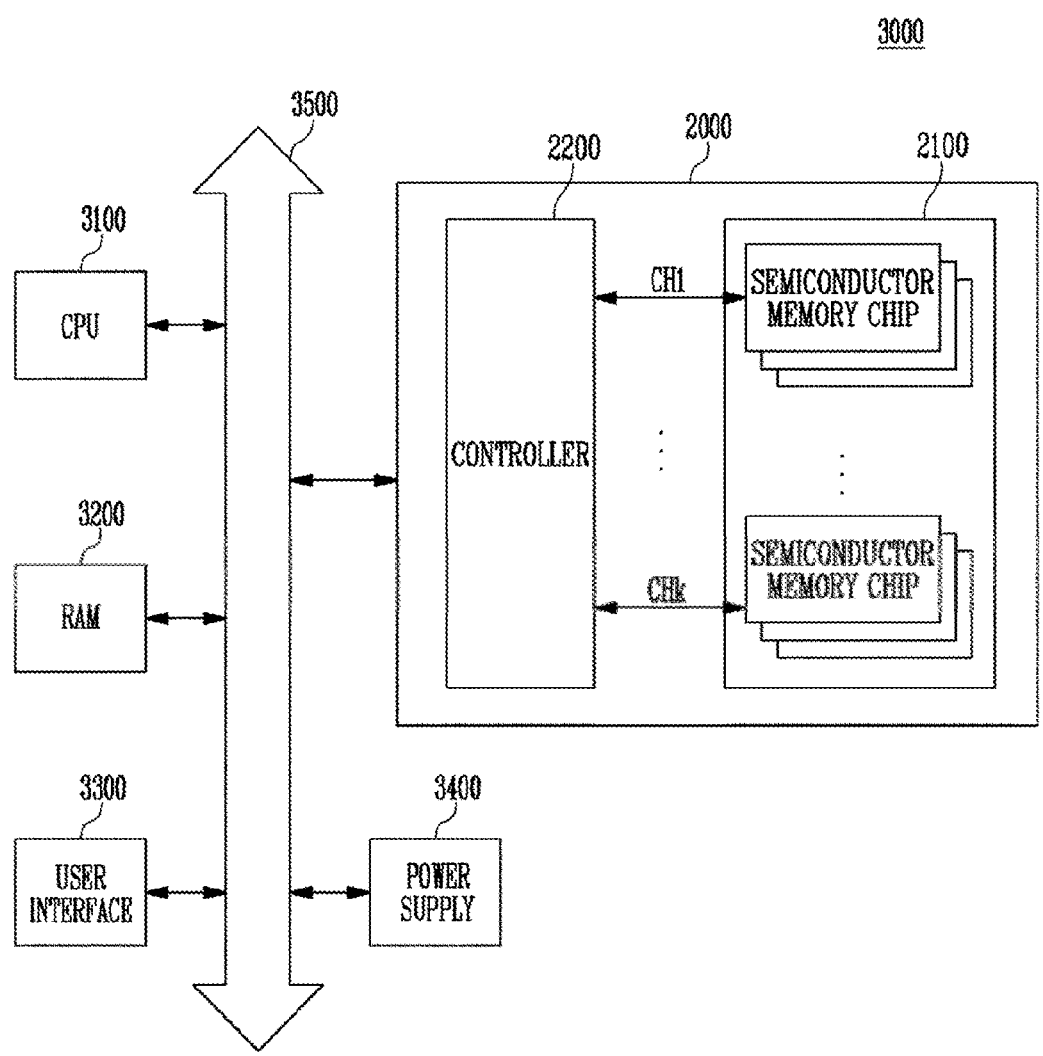
FIG. 8 is a block diagram illustrating a representation of an example of a computing system including the memory system explained in relation to FIG. 7.

FIG. 8 is a block diagram illustrating a representation of an example of a computing system including the memory system explained in relation to FIG. 7.

Referring to FIG. 8, the computing system 3000 may include a central processing unit (CPU) 3100, a RAM 3200, a user interface 3300, a power supply 3400, a system bus 3500, and a memory system 2000.

The memory system 2000 is electrically connected to the CPU 3100, RAM 3200, user interface 3300, and power supply 3400 through the system bus 3500. Data provided through the user interface 3300 or processed by the CPU 3100 is stored in the memory system 2000.

Referring to FIG. 8, the semiconductor memory device 2100 is illustrated to be connected to the system bus 3500 through the controller 2200. However, the semiconductor memory device 2100 may be directly connected to the system bus 3500. A function of the controller 2200 may be performed by the CPU 3100 and RAM 3200.

Referring FIG. 8, the memory system 2000 described in relation to FIG. 7 is illustrated. However, the memory system 2000 may be replaced with the memory system 1000 described in relation to FIG. 6. In an embodiment, the computing system 3000 may include all the memory systems 1000 and 2000 described in relation to FIGS. 7 and 6.

According to embodiments of the present disclosure, during the read operation of a semiconductor memory device, a stable read operation may be performed by adjusting a precharge potential level at a sensing node in a page buffer according to a temperature and securing a certain sensing margin despite of variation in temperature of the semiconductor memory device.

Various examples of the embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
a memory cell array;
a plurality of page buffers respectively connected to a plurality of bit lines of the memory cell array; and
a control logic configured to control the plurality of page buffers to perform an operation on the memory cell array,
wherein each of the plurality of page buffers senses a current amount, which varies according to a potential level of a corresponding bit line among the plurality of bit lines, at a sensing node to read data, and a precharge potential level at the sensing node is adjusted according to a temperature.

2. The semiconductor memory device according to claim 1, wherein the control logic comprises:
a temperature detecting unit configured to detect a temperature to output a temperature detection signal; and
a control signal generating unit configured to generate a kick signal in response to the temperature detection signal by adjusting a potential level of the kick signal according to the temperature.

3. The semiconductor memory device according to claim 2, wherein the temperature detection signal is a signal of which a bit value varies according to the temperature.

4. The semiconductor memory device according to claim 2, wherein the potential level of the kick signal is increased as the temperature increases, and is decreased as the temperature decreases.

5. The semiconductor memory device according to claim 2, wherein each of the plurality of page buffer comprises:
- a bit line sensing circuit, connected between one of the plurality of bit lines and an internal node, controlling a potential at the internal node according to a potential of one of the plurality of bit lines;
- a clamp circuit, connected between a power supply voltage terminal and the internal node, pre-charging the internal node;
- a latch circuit latching data during a sensing operation;
- a current determining circuit supplying, to the latch circuit, a current amount corresponding the potential at the sensing node in the clamp circuit; and
- a potential level adjusting unit, connected to the sensing node, adjusting the precharge potential level of the sensing node in response to the kick signal.

6. The semiconductor memory device according to claim 1, wherein in each of the plurality of page buffers, the precharge potential level at the sensing node is increased as the temperature increases, and is decreased as the temperature decreases.

7. The semiconductor memory device according to claim 1, wherein the memory cell array comprises a plurality of memory cells and each of the plurality of memory cells has a vertical channel structure.

8. The semiconductor memory device according to claim 7, wherein in the memory cell having the vertical channel structure, a cell current is increased as the temperature increases, and is decreased as the temperature decreases.

9. The semiconductor memory device according to claim 1, wherein the control logic is configured to control the plurality of page buffers to perform a read operation or a program operation on the memory cell array.

10. A semiconductor memory device comprising:
- a memory cell array including a plurality of memory cells; and
- a plurality of page buffers respectively connected to a plurality of bit lines of the memory cell array,
- wherein each of the plurality of page buffers includes a sensing node varying according to a potential level of a corresponding bit line among the plurality of bit lines, and a precharge potential level at the sensing node is adjusted according to a temperature.

11. The semiconductor memory device according to claim 10, further comprising a control logic configured to control the plurality of page buffers to perform a read operation on the memory cell array.

12. The semiconductor memory device according to claim 11, wherein the control logic comprises:
- a temperature detecting unit configured to detect a temperature to output a temperature detection signal; and
- a control signal generating unit configured to generate a kick signal in response to the temperature detecting signal by adjusting a potential level of the kick signal according to the temperature.

13. The semiconductor memory device according to claim 12, wherein the potential level of the kick signal is increased as the temperature increases, and is decreased as the temperature decreases.

14. The semiconductor memory device according to claim 10, wherein each of the plurality of page buffer comprises:
- a bit line sensing circuit, connected between one of the plurality of bit lines and an internal node, controlling a potential at the internal node according to a potential of one of the plurality of bit lines;
- a clamp circuit, connected between a power supply voltage terminal and the internal node, pre-charging the internal node;
- a latch circuit latching data during a sensing operation;
- a current determining circuit supplying, to the latch circuit, a current amount corresponding the potential at the sensing node in the clamp circuit; and
- a potential level adjusting unit, connected to the sensing node, adjusting the precharge potential level at the sensing node in response to the kick signal.

15. The semiconductor memory device according to claim 14, wherein in each of the plurality of page buffers, the precharge potential level at the sensing node is increased as the temperature increases, and is decreased as the temperature decreases.

16. The semiconductor memory device according to claim 10, wherein each of the plurality of memory cells is a memory cell having a vertical channel structure, and in the memory cell having the vertical channel structure, a cell current is increased as the temperature increases and the cell current is decreased as the temperature decreases.

17. An operation method of a semiconductor memory device, the operation method comprising:
- detecting a temperature of the semiconductor memory device when a command is externally input;
- setting a potential level of a kick signal according to the detected temperature;
- performing a sensing operation using a page buffer, which is connected to a memory cell through a bit line, and adjusting a precharge potential level at a sensing node in the page buffer according to the kick signal; and
- externally outputting sensed data as the sensing operation result.

18. The operation method according to claim 17, wherein in the adjusting a precharge potential level at the sensing node, the precharge potential level at the sensing node is increased as the detected temperature increases, and is decreased as the detected temperature decreases.

19. The operation method according to claim 17, wherein the memory cell is a memory cell having a vertical channel structure, and in the memory cell having the vertical channel structure, a cell current is increased as the temperature increases and the cell current is decreased as the temperature decreases.

20. The operation method according to claim 17, wherein the externally input command includes a read command or a program command.

* * * * *